United States Patent

Nakata et al.

Patent Number: 5,825,193
Date of Patent: Oct. 20, 1998

[54] SEMICONDUCTOR INTEGRATED CIRCUIT DEVICE

[75] Inventors: Yoshiro Nakata, Kyoto; Shin Hashimoto; Isao Miyanaga, both of Osaka, all of Japan

[73] Assignee: Matsushita Electric Industrial Co., Ltd., Osaka, Japan

[21] Appl. No.: 575,735

[22] Filed: Dec. 18, 1995

[30] Foreign Application Priority Data

Dec. 19, 1994 [JP] Japan ..................... 6-314396

[51] Int. Cl.$^6$ .................................... G01R 31/28
[52] U.S. Cl. ................ 324/763; 324/760; 324/765
[58] Field of Search ............... 324/158.1, 73.1, 324/765, 760, 763; 437/8; 371/15.1, 22.3, 22.6; 327/546, 525, 538, 543; 438/14, 17

[56] References Cited

U.S. PATENT DOCUMENTS

| | | | |
|---|---|---|---|
| 4,636,725 | 1/1987 | Santomango et al. | 324/760 |
| 5,315,167 | 5/1994 | Chan et al. | 327/542 |
| 5,349,290 | 9/1994 | Yamada | 324/158.1 |
| 5,365,250 | 11/1994 | Hirashima | 324/158.1 |
| 5,371,457 | 12/1994 | Lipp | 324/158.1 |
| 5,392,293 | 2/1995 | Hsue | 324/158.1 |
| 5,404,099 | 4/1995 | Sahara | 324/158.1 |
| 5,448,199 | 9/1995 | Park | 327/546 |

FOREIGN PATENT DOCUMENTS

| | | |
|---|---|---|
| 2-170069 | 6/1990 | Japan . |
| 3-204951 | 9/1991 | Japan . |
| 3-216899 | 9/1991 | Japan . |
| 3-216900 | 9/1991 | Japan . |
| 4-139850 | 5/1992 | Japan . |
| 5-196700 | 8/1993 | Japan . |

*Primary Examiner*—Vinh P. Nguyen
*Attorney, Agent, or Firm*—McDermott, Will & Emery

[57] ABSTRACT

A semiconductor integrated circuit apparatus having a plurality of semiconductor integrated circuit devices, each of the plurality of semiconductor devices including a semiconductor integrated circuit formed on a semiconductor substrate, a reference voltage input terminal formed on the semiconductor substrate which is operative for receiving a reference voltage input from outside of the semiconductor substrate, and a burn-in voltage control circuit formed on the semiconductor substrate operative for receiving the reference voltage which is output from the reference voltage input terminal. The burn-in voltage control circuit generates a burn-in supply voltage which is input to the semiconductor integrated circuit, and also maintains the burn-in supply voltage at the reference voltage level such that each of the integrated circuits receives a burn-in supply voltage having the same voltage level.

4 Claims, 4 Drawing Sheets

The employment of built-in self-test circuits cannot make it possible to determine whether a SIC device is satisfactory before a redundant remedy step. Burn-in time is wasted (the second problem).

SEMICONDUCTOR INTEGRATED CIRCUIT DEVICE

BACKGROUND OF THE INVENTION

This invention relates generally to a semiconductor integrated circuit (SIC) device and in particular, to an SIC device capable of performing "on-wafer" circuit testing or burn-in on a great number of SICs formed on a single wafer.

A high-speed, high-performance SIC capable of rapidly processing a great amount of information is considered a multimedia key device. Generally, in order to have a plurality of SIC devices operate at the same timing, their operations are synchronized with one another by a high-speed clock signal (i.e., a clock signal of from tens of megahertz to hundreds of megahertz).

As the level of SIC integration increases, and as the functionality of SIC increases, testing SIC devices becomes complicated and hence testing costs increase.

Additionally, it becomes necessary to identify early failures by means of a burn-in procedure, and the length of burn-in time increases.

In order to reduce the costs of testing, Japanese Patent Applications, laid open without substantial examination thereof under Nos. 03-216899 and 03-216900, show techniques. That is, a self-test circuit is incorporated into an SIC device, and is assigned a task to conduct a part of the SIC testing.

On the other hand, Japanese Patent Application, laid open without substantial examination thereof under No. 04-139850, shows a technique. This technique uses self-test circuits incorporated into SIC devices for on-wafer circuit testing or burn-in, and all the SIC devices are simultaneously subjected to a burn-in procedure with less contact.

In order to simultaneously subject a great number of SICs, which are formed on the same wafer and which operate in synchronism with an external signal, to an on-wafer circuit testing process or to a burn-in process by built-in self-test circuits, high-speed synchronizing signals must be applied to all the SIC devices in which the self-test circuit are incorporated. It is however difficult to transmit, in a multi-drop fashion, high-speed synchronizing signals to many SIC devices (e.g., 100 SIC devices) formed on, for example, a wafer having a diameter of 20 cm because of external environments (e.g., noise).

Although it is possible to generate high-speed synchronizing signals within an SIC device, it is hard to generate high-accuracy synchronizing signals because of manufacturing processing instability. Therefore, a conventional technique employing an approach of generating high-speed synchronizing signals within an SIC device may suffer poor testing accuracy.

Transmission of high-speed, high-accuracy synchronizing signals to individual SICs formed on the same wafer is impossible (the first problem).

Additionally, a conventional self-test circuit functions, only to determine whether the quality of SICs is satisfactory. For the case of some recent generations of semiconductor memories, even if it is found that some memory elements fail to work properly, these unsatisfactory elements are able to be remedied by a post-testing redundant remedy step. In other words, in a method of conducting on-wafer circuit testing with the aid of a self-test circuit, or a burn-in before a redundant remedy step, even a semiconductor memory that has a possibility of being remedied at a later step is classified as an unsatisfactory semiconductor memory.

Voltages are applied to individual SICs via a common power supply line at the time of conducting on-wafer circuit testing or burn-in, and the SICs are connected in parallel with the common power supply line. Generally, a current flowing through a power supply line is greater than a current flowing through a signal line, therefore suffering a drop in voltage because of its own resistance. As a result, different voltages are applied to individual SIC devices according to their locations on a wafer (the third problem).

There is a possibility that some of many SIC devices are unsatisfactory ones. If such failure is caused by, for example, short circuiting between an SIC device's power source and ground, an excess current flows in an unsatisfactory SIC device thereby affecting the way in which the other SIC devices are burned-in. Even if an unsatisfactory SIC device is removed by, for example, cutting a power supply line before a burn-in step, there is still a possibility that a different SIC device becomes an unsatisfactory one during the burn-in step.

As described above, the presence of an unsatisfactory SIC device prevents accurate testing or burn-in (the fourth problem).

SUMMARY OF THE INVENTION

Accordingly, with a view to solving the above-described problems with the prior art techniques, the present invention was made. Therefore, a first object of the present invention is to provide a technique capable of transmitting high-speed, high-accuracy synchronizing signals to individual SIC devices formed on the same wafer.

A second object of the present invention is to make it possible to determine, in a burn-in step, whether an unsatisfactory SIC will be able to be remedied later by a redundant circuit, without wasting the burn-in time.

A third object of the present invention is to apply the same voltage to all SIC devices formed on the same wafer, regardless of their on-wafer locations.

A fourth object of the present invention is to provide a technique capable of, even when there is an unsatisfactory SIC device, testing or burning-in the other SIC devices with reliable results.

The present invention provides a first SIC device to achieve the second object. In accordance with the first SIC device, the number of semiconductor elements that are determined in a burn-in step to be unsatisfactory is counted. It then becomes possible to determine whether a semiconductor device with unsatisfactory semiconductor elements can be remedied using redundant circuits.

The first SIC device comprises:
- a semiconductor integrated circuit which is formed on a semiconductor substrate, and which has semiconductor elements;
- a self-test circuit which is formed on the semiconductor substrate, for testing each of the semiconductor elements for the presence or absence of a failure, and for providing, when any one of the semiconductor elements tested is determined to suffer a failure, a failure signal;
- a failure counting circuit which is formed on the semiconductor substrate, for counting the number of times the self-test circuit provides a failure signal.

As a result of such arrangement, it becomes possible to accurately grasp the convergence of early-failure generation in a burn-in step. As a result, a waste of burn-in time can be avoided by setting an appropriate length of burn-in time.

It is preferable that the first SIC device further comprises:
a frequency multiplying circuit which is formed on the semiconductor substrate for receiving a clock signal, and for providing to the self-test circuit a reference signal whose frequency is a multiple of the clock signal's frequency;
wherein:
the self-test circuit operates in synchronism with the reference signal to test each of the semiconductor elements for the presence or absence of a failure.

As a result of such arrangement, the frequency of external signals can be reduced and, at the same time, it becomes possible to apply a high-frequency reference signal to a self-test circuit. Therefore, it is possible to reduce the ill-influence from external environments as well as to determine whether an SIC element works properly by a high-speed, high-accuracy synchronizing signal. The first object is accomplished accordingly.

In order to achieve the third object, the present invention provides a second SIC device having therein a voltage control circuit capable of keeping a burn-in supply voltage applied constant for supply to each SIC.

The second SIC device comprises:
a semiconductor integrated circuit which is formed on a semiconductor substrate, and which has a redundant remedy circuit;
a reference-voltage input terminal which is formed on the semiconductor substrate, for inputting a reference voltage;
a burn-in voltage control circuit which is formed on the semiconductor substrate, for keeping, based on the reference voltage which is inputted to the burn-in voltage control circuit, a burn-in supply voltage applied constant for supply to the semiconductor integrated circuit 82.

As a result of such arrangement, all SICs are fed the same voltage, regardless of their on-wafer locations. Without the influence from, for example, a drop in voltage, individual SIC devices can be subjected to an on-wafer circuit testing process or to a burn-in process at the same time.

It is preferable that the second SIC device further comprises:
a current restriction circuit for reducing, when an electric current in excess of a given value flows through a semiconductor integrated circuit, a voltage supplied by the burn-in voltage control circuit to the semiconductor integrated circuit so as to control the amount of electric current flowing through the semiconductor integrated circuit.

Such arrangement accomplishes the fourth object. More specifically, when an excess electric current flows in an SIC, the amount of current to be supplied to such an SIC is controlled, and, as a result, it becomes possible to safely subject the other SIC devices to a testing process or to a burn-in process.

In accordance with the present invention, it is possible to simultaneously subject a great number of SIC devices formed on the same wafer to an on-wafer circuit testing process or to a burn-in process with accuracy and precision.

DETAILED DESCRIPTION OF THE INVENTION

Figure 1:
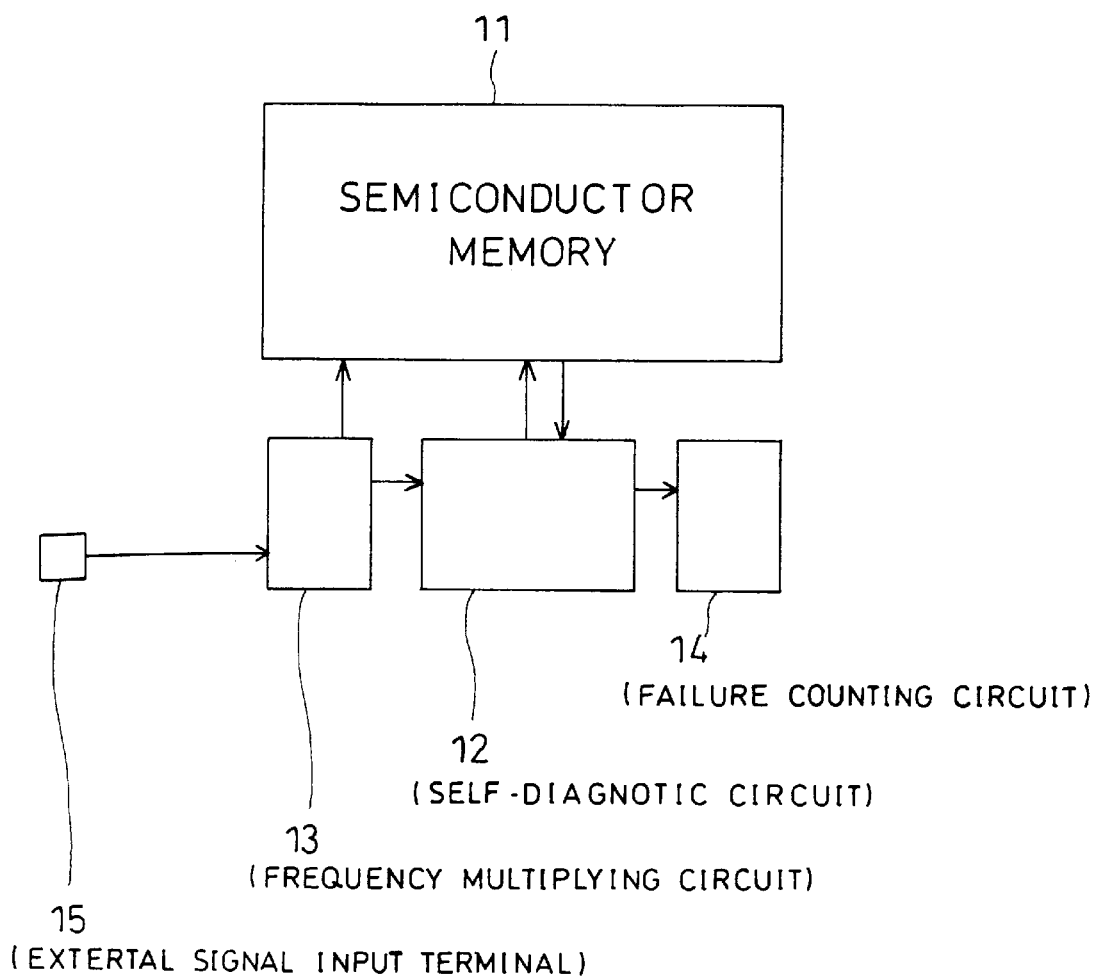
FIG. 1 is a block diagram illustrating an SIC device in accordance with a first embodiment of this invention.

A first embodiment of the present invention is described with making reference to FIG. 1. A semiconductor memory 11, a self-test circuit (SDC) 12, a frequency multiplying circuit 13, a failure counting circuit 14, and an external signal input terminal 15 are all formed on the same semiconductor substrate 85. The SDC 12 monitors the status of the semiconductor memory 11, in other words it checks each semiconductor element of the semiconductor memory 11 for the presence or absence of a failure. The frequency multiplying circuit 13 receives an external signal, and delivers a reference signal whose frequency is a multiple of the frequency of the received signal, to the semiconductor memory 11 and to the SDC 12. The failure counting circuit 14 counts the number of times the SDC 12 finds an unsatisfactory semiconductor element. The input terminal 15 receives an external signal.

The operation of a semiconductor integrated circuit (SIC) device of the first embodiment is described below. In the first embodiment, the semiconductor memory 11 is a 100-MHz, 16-Mbit, high-speed synchronous DRAM, and operates in synchronism with an external reference signal.

An external rectangular-wave signal of 12.5 MHz is applied at the input terminal 15 for forwarding to the frequency multiplying circuit 13. The multiplying circuit 13, upon receipt of the signal from the terminal 15, delivers a reference signal whose frequency is eight times the frequency of the received signal (i.e., 100 MHz), to the semiconductor memory 11 and to the SDC 12. The SDC 12 and the failure counting circuit 14 are reset as soon as the power is turned on, and start operating at the time when the frequency multiplying circuit 13 delivers the reference signal.

The SDC 12 provides a test signal in synchronism with the 100-MHz reference signal to the semiconductor memory 11, and an output signal from the semiconductor memory 11 is compared with an expected value so as to determine whether the semiconductor memory 11 is operating properly. The SDC 12 examines all memory elements including redundant memory elements of the semiconductor memory 11 for the presence or absence of a failure. When an output signal of the semiconductor memory 11 and an expected value disagree, the SDC 12 provides a signal indicative of a failure to the failure counting circuit 14.

The failure counting circuit 14 is increased every time it receives a failure-indicating signal from the SDC 12. When all the memory elements are tested, the failure counting circuit 14 provides the result of the counting operation, and is reset to zero.

In the present embodiment, the SDC 12 and the frequency multiplying circuit 13 are employed. A relatively low-frequency signal is applied at the terminal 15, and a self-test process can be performed using a fast reference signal from the frequency multiplying circuit 13 the speed of which is the same as the speed of real operations. Since the frequency multiplying circuit 13 capable of delivering a high-speed reference signal is located in the vicinity of the semiconductor memory 11, this eliminates the influence (e.g., noise) from external environments. Therefore, high-speed, high-accuracy testing can be performed.

Because of the employment of the SDC 12 and the failure counting circuit 14, even when there are some SIC devices whose quality remains unidentifiable before a remedy by a redundant circuit, it is possible to optimize the burn-in time by monitoring the convergence of early-failure screening from an increase in the number of unsatisfactory elements with time.

A SIC device in accordance with a second embodiment of the present invention is described below.

Figure 2:
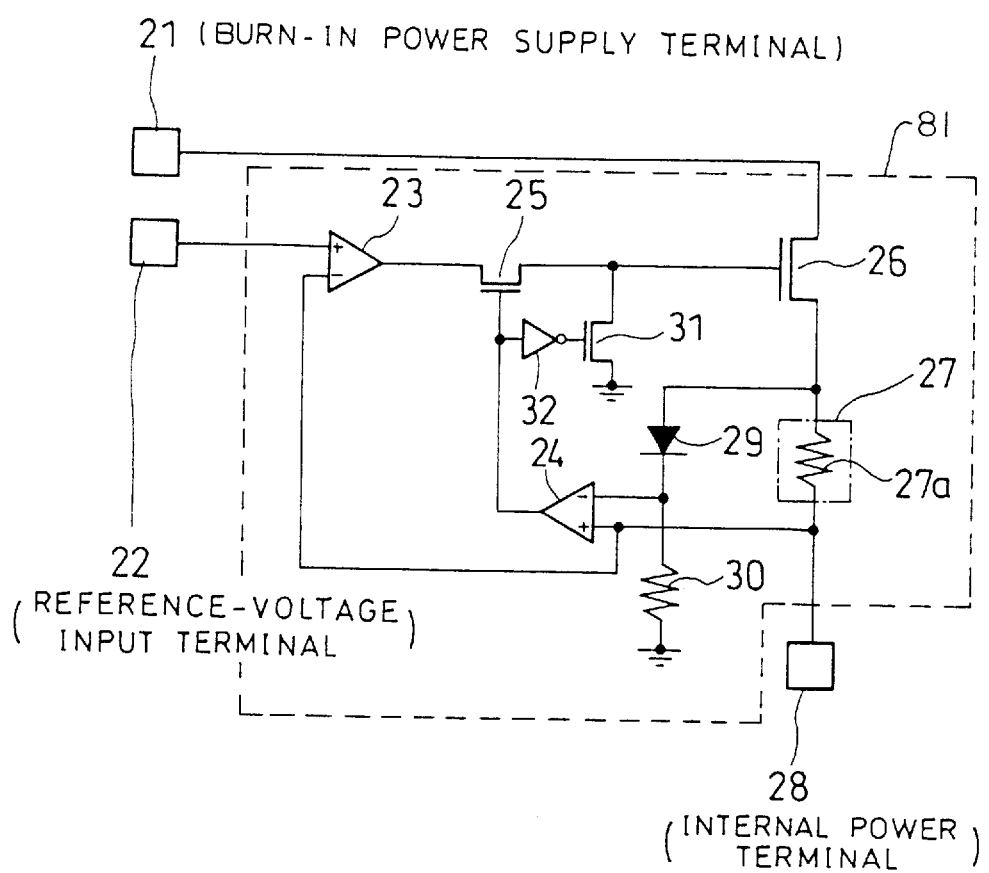
FIG. 2 is a circuit diagram illustrating a voltage control circuit in an SIC device in accordance with a second embodiment of this invention.

FIG. 2 shows a voltage control circuit 81 arranged in a SIC device 80 of the present embodiment. 21 is a burn-in power supply terminal. 22 is a reference-voltage input terminal. 23 is a first comparator. 24 is a second comparator. 25 is a first MOSFET of n-type. 26 is a second MOSFET of n-type. 31 is a third MOSFET of n-type. 27 is a current detector formed of a resistor 27a for detection of electric current. 28 is an internal power terminal. 29 is a diode. 30 is a resistor.

A supply voltage, applied at the terminal 21, is fed via the MOSFET 26 and the resistor 27a to the terminal 28. As shown in FIG. 2, the potential of the terminal 28 is compared by the comparator 23 with a reference voltage applied at the terminal 22. The comparator 23 provides a low-level voltage when the potential of the terminal 28 is found to be greater than the reference voltage. On the other hand, the comparator 23 provides a high-level voltage when the potential of the terminal 28 is found to be lower than the reference voltage. The output voltage of the comparator 23 is fed via the MOSFET 25 to the gate electrode of the MOSFET 26. If the comparator 23 outputs a high-level voltage, this opens the gate of the MOSFET 26 to increase the potential of the terminal 28. On the other hand, the comparator 23 outputs a low-level voltage, this closes the gate of the MOSFET 26 to decrease the potential of the MOSFET 26. This ensures that the voltage applied at the terminal 28 and the reference voltage always agree.

Power consumption in an SIC device is detected by the current detector 27 as a voltage appearing across the resistor 27a. This voltage detected is compared by the comparator 24 with a pn junction forward current voltage of the diode 29 (about 0.5 V). An electric current, which flows through the diode 29, is set by the resistor 30 at about 10 $\mu$A. For example, if the resistor 27a is 5 Ω, this produces a potential difference of 0.5 V across the resistor 27a. When such a potential difference exceeds 0.5 V, the output of the comparator 24 decreases. As a result, the MOSFET 25 turns off and the MOSFET 31 turns on, therefore reducing the gate voltage of the MOSFET 26. This controls the amount of electric current to be applied to the terminal 28.

Figure 3:
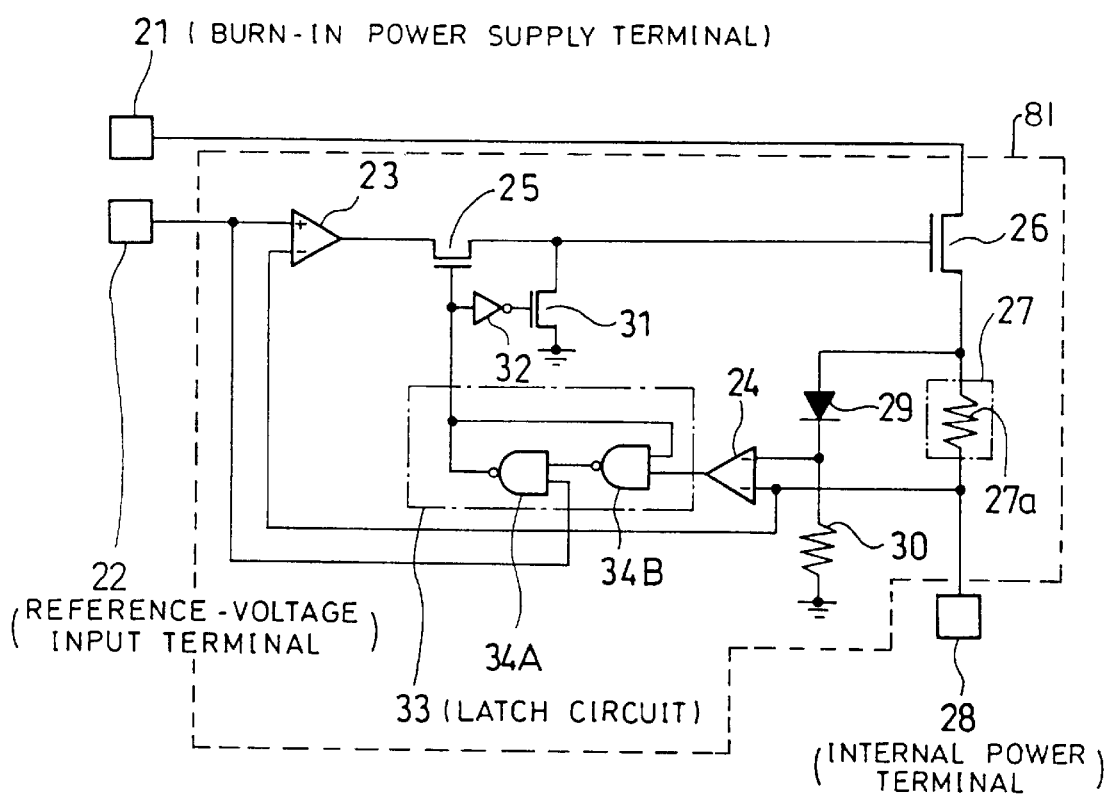
FIG. 3 is a revision of the FIG. 2 voltage control circuit.

FIG. 3 shows a revision of the FIG. 2 voltage control circuit with the addition of a latch circuit 33 made up of a first-stage NAND circuit 34A and a second-stage NAND circuit 34B. Elements of the FIG. 3 voltage control circuit similar to their counterparts of the FIG. 2 voltage control circuit are indicated using the same reference numerals, and they are not described.

As shown in FIG. 3, the latch circuit 33 is coupled to the output of the comparator 24. As a result of such arrangement, once an excess electric current above a given value flows, the gate voltage of the MOSFET 26 is kept at low level thereby controlling the amount of electric current to be applied to the terminal 26. In the FIG. 3 circuit, once the output of the comparator 24 decreases, with a voltage applied at the terminal 22, the output of the latch circuit 33 remains low even when the output of the comparator 24 increases. The output of the latch circuit 33 is latched low, except when the voltage of the terminal 22 is decreased. It is therefore possible to cut power to an SIC device before or during the burn-in process when an excess electric current flows.

As described above, in accordance with the second embodiment, it is arranged such that the voltage applied to the terminal 28 and the reference voltage agree. This enables individual SIC devices to be fed the same voltage, regardless of their on-wafer locations.

Additionally, if power is consumed excessively, the amount of electric current flowing in an SIC device is controlled automatically or power to an SIC device is cut automatically. This illuminates the ill-influence from an unsatisfactory SIC device to the other SIC devices.

Figure 4:
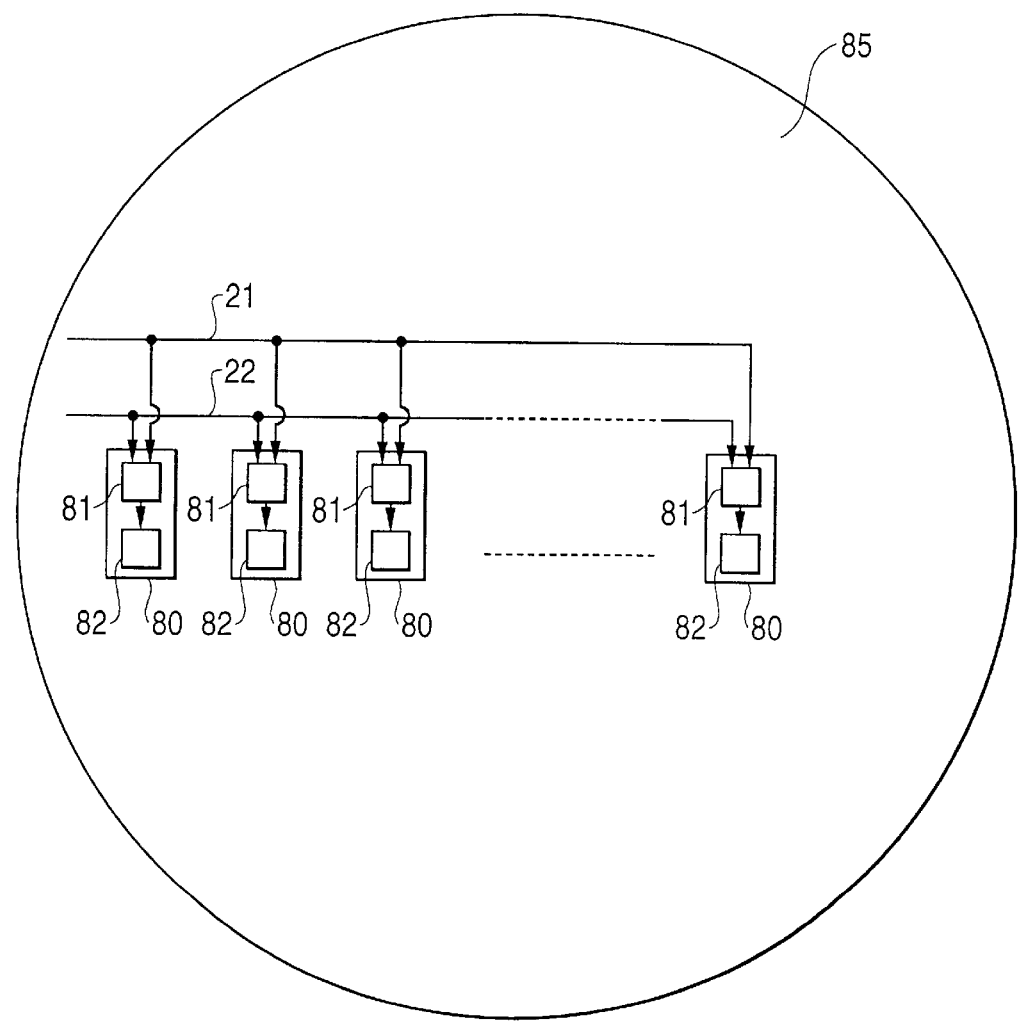
FIG. 4 illustrates an exemplary embodiment of a plurality of semiconductor integrated circuit devices configured on a wafer in accordance with the present invention.

FIG. 4 illustrates an exemplary embodiment of a plurality of semiconductor devices 80 configured on a wafer 85 in accordance with the present invention. As shown, each semiconductor device 80 comprises a voltage control circuit 81 coupled to a semiconductor integrated circuit 82. In addition, each voltage control circuit 81 is coupled to the burn-in power supply terminal 21 and the reference voltage input terminal 22.

The invention claimed is:

1. A semiconductor integrated circuit device comprising:

a semiconductor integrated circuit formed on a semiconductor substrate;

a reference-voltage input terminal formed on said semiconductor substrate, said reference-voltage input terminal operative for receiving a reference voltage input from outside of said semiconductor substrate;

a burn-in voltage control circuit formed on said semiconductor substrate, said burn-in voltage control circuit operative for receiving said reference voltage which is output from said reference-voltage input terminal, said burn-in voltage control circuit generating a burn-in supply voltage which is input to said semiconductor integrated circuit, said burn-in voltage control circuit maintaining said burn-in supply voltage at said reference voltage level.

2. A semiconductor integrated circuit device according to claim 1, wherein said burn-in voltage control circuit comprises a current restriction circuit for reducing, when an electric current in excess of a given value flows through said semiconductor integrated circuit, a voltage supplied by said burn-in voltage control circuit to said semiconductor integrated circuit so as to control the amount of electric current that flows through said semiconductor integrated circuit.

3. A semiconductor integrated circuit apparatus having a plurality of semiconductor integrated circuit devices, each of said plurality of semiconductor integrated circuit devices comprising:

a semiconductor integrated circuit formed on a semiconductor substrate, a reference-voltage input terminal formed on said semiconductor substrate, said reference-voltage input terminal operative for receiving a reference voltage input from outside of said semiconductor substrate;

a burn-in voltage control circuit formed on said semiconductor substrate, said burn-in voltage control circuit operative for receiving said reference voltage which is output from said reference-voltage input terminal, said burn-in voltage control circuit generating a burn-in supply voltage which is input to said semiconductor integrated circuit, said burn-in voltage control circuit maintaining said burn-in supply voltage at said reference voltage level, wherein each of said integrated circuits receive said burn-in supply voltage having the same voltage level.

4. A semiconductor integrated circuit apparatus according to claim 3, wherein each of said burn-in voltage control circuits comprises a current restriction circuit for reducing, when an electric current in excess of a given value flows through said semiconductor integrated circuit, a voltage supplied by said burn-in voltage control circuit to said semiconductor integrated circuit so as to control the amount of electric current that flows through said semiconductor integrated circuit.

* * * * *